(12) United States Patent
Jung

(10) Patent No.: US 12,382,582 B2
(45) Date of Patent: Aug. 5, 2025

(54) PRINTED CIRCUIT BOARD

(71) Applicant: LG INNOTEK CO., LTD., Seoul (KR)

(72) Inventor: Won Suk Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/628,945

(22) Filed: Apr. 8, 2024

(65) Prior Publication Data

US 2024/0260189 A1  Aug. 1, 2024

Related U.S. Application Data

(63) Continuation of application No. 17/934,819, filed on Sep. 23, 2022, now Pat. No. 11,979,985, which is a (Continued)

(30) Foreign Application Priority Data

Dec. 10, 2018 (KR) .................. 10-2018-0158282

(51) Int. Cl.
*H05K 1/11* (2006.01)
*H05K 1/03* (2006.01)
*H05K 1/18* (2006.01)

(52) U.S. Cl.
CPC .......... *H05K 1/115* (2013.01); *H05K 1/0306* (2013.01); *H05K 1/185* (2013.01); *H05K 2201/096* (2013.01)

(58) Field of Classification Search
CPC ...... H05K 1/115; H05K 1/0306; H05K 1/182; H05K 1/183; H05K 1/185; H05K 2201/096
See application file for complete search history.

(56) References Cited

U.S. PATENT DOCUMENTS 6,292,366 B1 * 9/2001 Platt .................... H05K 1/0272
                                                                361/764
7,834,441 B2  11/2010 Kamiya et al.
(Continued)

FOREIGN PATENT DOCUMENTS

CN        101120445 A    2/2008
CN        101198210 A    6/2008
(Continued)

OTHER PUBLICATIONS

International Search Report dated Mar. 24, 2020 in International Application No. PCT/KR2019/017333.
(Continued)

*Primary Examiner* — Timothy J Thompson
*Assistant Examiner* — John B Freal
(74) *Attorney, Agent, or Firm* — Saliwanchik, Lloyd & Eisenschenk

(57) ABSTRACT

A printed circuit board according to an embodiment includes: a first insulating portion having a cavity; a second insulating portion disposed on the first insulating portion; a third insulating portion disposed under the first insulating portion; and an electronic device disposed in the cavity, wherein a number of layers of the second insulating portion is different from a number of layers of the third insulating portion, and has an asymmetric structure with respect to the first insulating portion in which the electronic device is disposed.

10 Claims, 10 Drawing Sheets

Related U.S. Application Data continuation of application No. 17/312,838, filed as application No. PCT/KR2019/017333 on Dec. 10, 2019, now Pat. No. 11,470,721.

(56) References Cited

U.S. PATENT DOCUMENTS

| | | |
|---|---|---|
| 7,879,656 B2 | 2/2011 | Kamiya et al. |
| 8,692,391 B2 | 4/2014 | Jeong et al. |
| 9,362,217 B2 | 6/2016 | Lin et al. |
| 9,781,835 B2 | 10/2017 | Jung et al. |
| 9,905,540 B1 | 2/2018 | Nam |
| 9,966,333 B2 | 5/2018 | Tsai et al. |
| 2010/0175250 A1 | 7/2010 | Kamiya et al. |
| 2010/0300738 A1 | 12/2010 | Ito et al. |
| 2010/0300783 A1 | 12/2010 | Seegert et al. |
| 2015/0364410 A1 | 12/2015 | Hando et al. |
| 2015/0366062 A1 | 12/2015 | Noda et al. |
| 2016/0351543 A1 | 12/2016 | Ryu et al. |
| 2017/0033036 A1 | 2/2017 | Kajihara et al. |
| 2017/0094797 A1 | 3/2017 | Baek et al. |
| 2017/0127517 A1 | 5/2017 | Ishihara et al. |
| 2018/0033719 A1 | 2/2018 | Tsai et al. |
| 2019/0198446 A1 | 6/2019 | Sawada |

FOREIGN PATENT DOCUMENTS

| | | |
|---|---|---|
| EP | 2 911 484 B1 | 8/2018 |
| KR | 10-0653247 B1 | 12/2006 |
| KR | 10-2007-0076798 A | 7/2007 |
| KR | 10-2008-0011106 A | 1/2008 |
| KR | 10-2009-0062709 A | 6/2009 |
| KR | 10-2012-0026855 A | 3/2012 |
| KR | 10-2014-0056916 A | 5/2014 |
| KR | 10-2015-0092881 A | 8/2015 |
| KR | 10-2015-0099072 A | 8/2015 |
| KR | 10-2016-0122437 A | 10/2016 |
| KR | 10-2018-0021955 A | 3/2018 |

OTHER PUBLICATIONS

Office Action dated Feb. 7, 2022 in U.S. Appl. No. 17/312,838.
Notice of Allowance dated Jun. 3, 2022 in U.S. Appl. No. 17/312,838.
Office Action dated May 6, 2023 in Chinese Application No. 201980082060.3.
Office Action dated Apr. 19, 2023 in U.S. Appl. No. 17/934,819.
Office Action dated Aug. 23, 2023 in U.S. Appl. No. 17/934,819.
Notice of Allowance dated Jan. 3, 2024 in U.S. Appl. No. 17/934,819.
Office Action dated Jun. 21, 2024 in Korean Application No. 10-2018-0158282.

* cited by examiner

PRINTED CIRCUIT BOARD

CROSS-REFERENCE TO RELATED APPLICATIONS

This application is a continuation of U.S. application Ser. No. 17/934,819, filed Sep. 23, 2022; which is a continuation of U.S. application Ser. No. 17/312,838, filed Jun. 10, 2021, now U.S. Pat. No. 11,470,721, issued Oct. 11, 2022; which is the U.S. national stage application of International Patent Application No. PCT/KR2019/017333, filed Dec. 10, 2019, which claims the benefit under 35 U.S.C. § 119 of Korean Application No. 10-2018-0158282, filed Dec. 10, 2018, the disclosures of each of which are incorporated herein by reference in their entirety.

TECHNICAL FIELD

An embodiment relates to a printed circuit board, and more particularly, to a printed circuit board embedding an electronic device.

BACKGROUND ART

Unlike conventional printed circuit boards in which passive devices and active devices share the surface of a printed circuit board, an embedded printed circuit board has devices such as resistors and capacitors embedded in the board. Since it is possible to secure a free space on a surface of the substrate, it is possible to increase a wiring density compared to the conventional printed circuit board, thereby enabling the development of a more compact electronic device.

In addition, these embedded printed circuit board has effect of reducing problems such as impedance generation and signal delay due to parasitic effects in electronic devices that use high-frequency signals because the elements are connected in a vertical direction and the wiring length is greatly reduced.

The core technology of such an embedded printed circuit board is a technology for embedding an element in the board and a technology for precisely connecting the embedded element and a wiring circuit.

In general, the embedded printed circuit board performs a cavity forming process of removing a device mounting area after forming the insulating layer. In the related art, an embedded printed circuit board is manufactured by mounting a device in the formed cavity and laminating an additional insulating layer on top and bottom of the insulating layer on which the device is mounted, respectively.

DISCLOSURE

Technical Problem

In the embodiment, a printed circuit board and a method of manufacturing the same are provided with an embedded electronic device having an asymmetric structure.

In addition, in the embodiment, an electronic device embedded printed circuit board and a manufacturing method thereof capable of improving design freedom while reducing the thickness of the substrate are provided.

The technical problems to be achieved in the proposed embodiment are not limited to the technical problems mentioned above, and other technical problems not mentioned may be clearly understood by those of ordinary skill in the art to which the proposed embodiment belongs from the following description.

Technical Solution

A printed circuit board according to an embodiment includes: a first insulating portion having a cavity; a second insulating portion disposed on the first insulating portion; a third insulating portion disposed under the first insulating portion; and an electronic device disposed in the cavity, wherein a number of layers of the second insulating portion is different from a number of layers of the third insulating portion, and has an asymmetric structure with respect to the first insulating portion in which the electronic device is disposed.

In addition, the first insulating portion includes at least one first insulating layer; a first circuit pattern buried in a lower part of the first insulating layer; a second circuit pattern disposed on an upper surface of the first insulating layer; and a first via disposed in the first insulating layer and connecting the first and second circuit patterns.

Further, the first insulating layer is formed of a prepreg containing glass fibers.

In addition, the second insulating portion includes a second insulating layer disposed in the cavity and on the first insulating layer; a third circuit pattern disposed on an upper surface of the second insulating layer; and a second via disposed in the second insulating layer and connecting the second and third circuit patterns, wherein the second insulating layer is composed of an insulating material different from the insulating layer constituting the first insulating layer and the third insulating portion.

In addition, the second insulating layer is formed of RCC (Resin Coated Copper).

In addition, the third insulating portion may include a third insulating layer disposed under the first insulating layer; at least one fourth insulating layer disposed under the third insulating layer; a third via disposed in the third insulating layer; a fourth via disposed in the fourth insulating layer; a fourth circuit pattern disposed under a lower surface of the third insulating layer; and a fifth circuit pattern disposed under a lower surface of the fourth insulating layer, wherein the third insulating layer is formed of an insulating material different from the first, second, and fourth insulating layers.

In addition, the third insulating layer is formed of ABF (Aginomoto Build-up Film) or PID (Photo Imagable Dielectric).

In addition, the third insulating layer has a thickness smaller than each of the first insulating layer, the second insulating layer, and the fourth insulating layer.

In addition, the third via includes a first sub-third via overlapping the electronic device in a vertical direction and directly connected to a terminal of the electronic device, and a second sub-third via disposed at a position not overlapping the electronic device in a vertical direction, wherein the first sub-third via has a width smaller than that of the second sub-third via.

In addition, a width of the second sub-third via is same as a width of each of the first via, the second via, and the fourth via.

Meanwhile, a method of manufacturing a printed circuit board according to an embodiment includes forming a first insulating portion including at least one first insulating layer, a first circuit pattern buried in a lower part of the first insulating layer, and a second insulating layer disposed on an upper surface of the first insulating layer, and a first via disposed in the first insulating layer and connecting the first and second circuit patterns; forming a cavity passing the first insulating layer in the first insulating portion; forming a film layer under the first insulating portion; attaching an electronic device on the film layer exposed through the cavity; forming a second insulating portion on the first insulating portion, wherein the second insulating portion includes a second insulating layer disposed in the cavity and on the first insulating layer, a third circuit pattern disposed on an upper surface of the second insulating layer, and a second via disposed in the second insulating layer and connecting the second and third circuit patterns, removing the film layer; and forming a third insulating portion including a third insulating layer disposed under the first insulating portion, at least one fourth insulating layer disposed under the third insulating layer, a third via disposed in the third insulating layer, and a fourth via disposed in the fourth insulating layer, a fourth circuit pattern disposed under a lower surface of the third insulating layer, and a fifth circuit pattern disposed under a lower surface of the fourth insulating layer, wherein the forming of the third insulating portion includes forming a dummy insulating portion on the second insulating portion to correspond to each of the at least one fourth insulating layer, the fourth via, and the fifth circuit pattern, and removing the dummy insulating portion when the third insulating portion is formed, wherein the number of layers of the insulating layer constituting the second insulating portion is different from the number of layers of the insulating layer constituting the third insulating portion, and has an asymmetric structure with respect to the first insulating portion in which the electronic device is disposed.

In addition, the first and fourth insulating layers are formed of a prepreg containing glass fiber, the second insulating layer is formed of RCC (Resin Coated Cu), and the third insulating layer is ABF (Aginomoto Build-up Film) or PID (Photo Imagable Dielectric).

In addition, the third via includes a first sub-third via overlapping the electronic device in a vertical direction and directly connected to a terminal of the electronic device, and a second sub-third via disposed at a position not overlapping the electronic device in a vertical direction, wherein the first sub-third via has a width smaller than that of the second sub-third via, and a width of the second sub-third via is same as widths of the first via, the second via and the fourth via.

Effects of the Invention

According to an embodiment, the printed circuit board includes a first insulating portion in which a cavity in which an electronic device is disposed is formed. In addition, a circuit pattern or a pad is buried and disposed in the first insulating portion. Accordingly, as the circuit pattern or the pad is buried and disposed in the first insulating portion, the thickness of the printed circuit board can be reduced by the thickness of the circuit pattern compared to the prior art, and design freedom can be improved. In addition, since the first insulating portion uses a prepreg including glass fiber, it is possible to minimize the occurrence of panel cracking or warping that occurs when manufacturing a thin substrate.

Further, according to an embodiment, a second insulating portion is disposed under the first insulating portion of the printed circuit board. At this time, the second insulating portion is configured to form an insulating layer using a film-type resin (for example, ABF (Aginomoto Build-up Film) or PID (Photo Imagable Dielectric) which is a photosensitive insulating material) in a region in direct contact with the first insulating portion. Accordingly, in the embodiment, the thickness of the insulating layer of the second insulating portion may be reduced compared to the prior art, and design freedom may be improved.

In addition, according to an embodiment, a small via may be formed by forming the second insulating portion on the area in direct contact with the first insulating portion with a film-type resin, and thus a fine pattern may be implemented.

In addition, the prior art has a vertical symmetry structure as the chip is placed in the center. On the other hand, according to an embodiment, a fan out panel level package (fan pit panel level package) structure may be implemented with an asymmetric structure.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Figure 1:
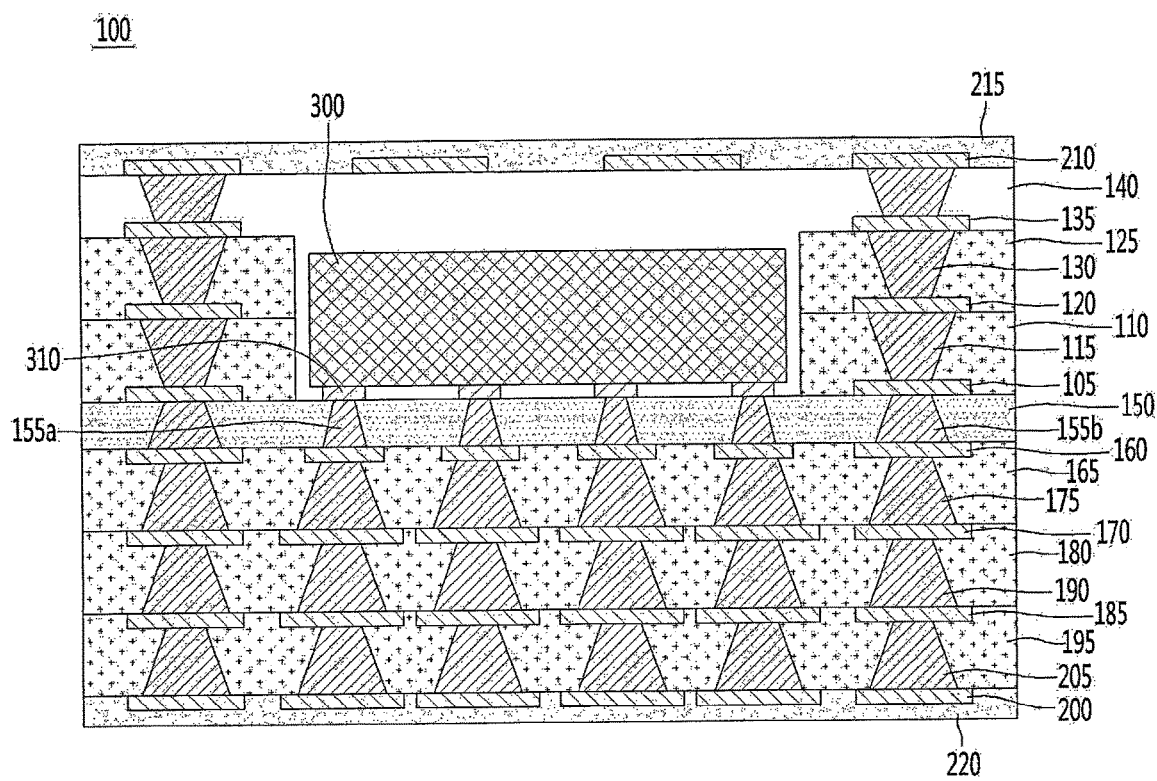
FIG. 1 is a view illustrating a structure of a printed circuit board according to an embodiment.

FIG. 1 is a view illustrating a structure of a printed circuit board according to an embodiment.

Referring to FIG. 1, the printed circuit board may include a first insulating portion, a second insulating portion, and a third insulating portion. The first insulating portion may include a central insulating layer, the second insulating portion may include an upper insulating layer disposed on the first insulating portion, and the third insulating portion may include a lower insulating layer disposed under the first insulating portion.

The first insulating portion includes an insulating layer in which the electronic device 300 is buried. To this end, the first insulating portion may include a first insulating layer 110 and a second insulating layer 125. In addition, a cavity C in which the electronic device 300 is disposed may be formed in the first insulating layer 110 and the second insulating layer 125. In this case, the first insulating portion may be referred to as a core insulating portion, and accordingly, the first insulating layer 110 and the second insulating layer 125 may be referred to as a core insulating layer.

The first insulating layer 110 and the second insulating layer 125 are substrates on which electric circuits capable of changing wiring are arranged, and this may include all of a printed circuit board, a wiring board, and an insulating substrate made of an insulating material capable of forming at least one circuit pattern on a surface.

The first insulating layer 110 and the second insulating layer 125 may include glass or plastic. In detail, the first insulating layer 110 and the second insulating layer 125 include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In this case, a plurality of circuit patterns may be disposed on surfaces of the first insulating layer 110 and the second insulating layer 125.

A first circuit pattern 105 may be buried in a lower part of the first insulating layer 110. A second circuit pattern 120 may be disposed on an upper surface of the first insulating layer 110. Also, a third circuit pattern 135 may be disposed on an upper surface of the second insulating layer 125. In this case, when the first insulating layer 110 and the second insulating layer 125 are viewed as one insulating layer, a lower circuit pattern disposed under the insulating layer is buried and disposed in the insulating layer, and an upper circuit pattern disposed above the insulating layer is disposed to protrude on the insulating layer. That is, in the related art, both the upper and lower circuit patterns are formed to protrude from the upper and lower surfaces of the insulating layer. On the contrary, in the embodiment, the first circuit pattern 105 may be buried in a lower part of the first insulating layer 110. Accordingly, in the embodiment, the thickness of the insulating layer (to be described later) 150 disposed under the first insulating layer 110 can be reduced by the thickness of the first circuit pattern 105. That is, basically, since the insulating layer is disposed while covering the circuit pattern, the thickness of the circuit pattern is determined as the basic offset thickness. On the other hand, in the embodiment, as the first circuit pattern 105 is buried and disposed in a lower part of the first insulating layer 110, the thickness of the insulating layer to be laminated under the first insulating layer 110 may be reduced by about 12 to 18 umcompared to the prior art.

In addition, the first circuit pattern 105, the second circuit pattern 120, and the third circuit pattern 135 are wires that transmit electrical signals, and may be formed of a metal material having high electrical conductivity. To this end, the first circuit pattern 105, the second circuit pattern 120 and the third circuit pattern 135 may be formed of at least one metal material selected from gold (Au), silver (Ag), platinum (Pt), titanium (Ti), tin (Sn), copper (Cu), and zinc (Zn).

In addition, the first circuit pattern 105, the second circuit pattern 120, and the third circuit pattern 135 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first circuit pattern 105, the second circuit pattern 120, and the third circuit pattern 135 may be formed of copper (Cu) having high electrical conductivity and a relatively inexpensive price.

The first circuit pattern 105, the second circuit pattern 120, and the third circuit pattern 135 can be formed by an additive process, a subtractive process, MSAP (Modified Semi Additive Process) and SAP (Semi Additive Process) method or the like, which are typical printed circuit board manufacturing processes, and a detailed description thereof will be omitted.

A first via 115 is formed in the first insulating layer 110. In addition, a second via 130 is formed in the second insulating layer 125. The first via 115 and the second via 130 electrically connect circuit patterns disposed on different layers to each other. The first via 115 may electrically connect the first circuit pattern 105 and the second circuit pattern 120. In addition, the second via 130 may electrically connect the second circuit pattern 120 and the third circuit pattern 135.

The first via 115 and the second via 130 may penetrate only one of the first insulating layer 110 and the second insulating layer 125, and alternatively, it may be formed while passing through at least two of the plurality of insulating layers in common. Accordingly, the first via 115 and the second via 130 electrically connect circuit patterns disposed on surfaces of different insulating layers to each other.

The first via 115 and the second via 130 may be formed by filling a through hole (not shown) passing through at least one of the first insulating layer 110 and the second insulating layer 125 with a conductive material.

The through hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, at least one of plurality of insulating layers may be opened by using a chemical containing aminosilane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the first via 115 and the second via 130 may be formed by filling the inside of the through hole with a conductive material. The metal material forming the first via 115 and the second via 130 is selected from copper (Cu), silver (Ag), tin (Sn), gold (Au), nickel (Ni), and palladium (Pd), and the conductive material filling may use any one of electroless plating, electroplating, screen printing, sputtering, evaporation, ink jetting, and dispensing, or a combination thereof.

The electronic device 300 may be embedded in the cavity C commonly formed in the first insulating layer 110 and the second insulating layer 125.

The electronic device 300 may be an electronic component such as a chip, and may be divided into an active device and a passive device. In addition, the active device is a device that actively uses a non-linear part, and the passive device refers to a device that does not use non-linear characteristics even though both linear and non-linear characteristics exist. In addition, the passive device may include a transistor, an IC semiconductor chip, and the like, and the passive device may include a capacitor, a resistor, and an inductor. The passive element is mounted on a conventional printed circuit board to increase a signal processing speed of a semiconductor chip, which is an active element, or to perform a filtering function.

The electronic device 300 may vary depending on the application to which the printed circuit board is applied. For example, when applied to a NAND flash memory product applied to a smartphone, the electronic device 300 may be a control device component.

A terminal 310 may be formed on a lower surface of the electronic device 300. In this case, a lower surface of the terminal 310 may be disposed on the same plane as the lower surface of the first insulating layer 110. The lower surface of the terminal 310 may be disposed on the same plane as the lower surface of the first circuit pattern 105. Meanwhile, the upper surface of the electronic device 300 may be disposed on the same plane as the upper surface of the second insulating layer 125. Preferably, the upper surface of the electronic device 300 may be disposed lower than the upper surface of the second insulating layer 125. That is, the cavity C may have the same thickness as the electronic device 300, and may have a thickness greater than the thickness of the electronic device 300 to improve reliability. Preferably, the cavity C may have a thickness greater than that of the electronic device 300 by about 10 µm. Accordingly, the upper surface of the electronic device 300 may be positioned lower than the upper surface of the second insulating layer 125. In addition, the width of the cavity C may have a greater width than the width of the electronic device 300 for stable arrangement of the electronic device 300.

Here, the first insulating portion compared to the existing structure, the first circuit pattern 105 has a structure buried in lower part of the first insulating layer 110 rather than a structure protruding from the lower surface of the first insulating layer 110. This may be achieved by a differentiated manufacturing process in an embodiment, not a typical printed circuit board manufacturing process. This will be described in more detail below.

According to an embodiment, the printed circuit board includes a first insulating portion in which a cavity in which an electronic device is disposed is formed. In addition, a circuit pattern or a pad is buried in the first insulating portion and disposed. Accordingly, as the circuit pattern or the pad is buried and disposed in the first insulating portion, the thickness of the printed circuit board can be reduced by the thickness of the circuit pattern compared to the prior art, and design freedom can be improved. In addition, since the first insulating portion uses a prepreg including glass fiber, it is possible to minimize the occurrence of panel cracking or warping that occurs when manufacturing a thin substrate.

A second insulating portion may be disposed on the first insulating portion, and a third insulating portion may be disposed under the first insulating portion. In this case, in an embodiment, the second insulating portion may be composed of a single insulating layer, and the third insulating portion may be composed of a plurality of insulating layers.

In this case, the insulating layer constituting the second insulating portion, a part of insulating layers constituting the third insulating portion, and the insulating layer constituting the first insulating portion may all be formed of different insulating materials. That is, as described above, the first insulating layer 110 and the second insulating layer 125 of the first insulating portion are formed of a prepreg including glass fibers.

Alternatively, the third insulating layer 140 constituting the second insulating portion may be formed of Resin Coated Cu (RCC). In this case, the third insulating layer 140 is disposed on the second insulating layer 125 and is also disposed in the cavity C formed in the second insulating layer 125 and the first insulating layer 110. That is, the third insulating layer 140 may be disposed on the second insulating layer 125 to have a predetermined thickness while filling the cavity C.

That is, as described above, the third insulating layer 140 must be disposed on the second insulating layer 125 with a uniform thickness while stably filling the cavity C. In this case, a curvature may be formed on the upper surface of the third insulating layer 140 according to the area of the cavity C. This is because the thickness of the third insulating layer 140 in the region where the cavity C exists and the region other than the region are different from each other. Accordingly, in an embodiment, by forming the third insulating layer 140 in the RCC type as described above, while solving the above problems, it is possible to manufacture a reliable substrate.

A fourth circuit pattern 210 may be disposed on an upper surface of the third insulating layer 140. In addition, a third via 225 may be disposed in the third insulating layer 140 while passing through the third insulating layer 140. The third via 225 may electrically connect the third circuit pattern 135 disposed on the second insulating layer 125 and the fourth circuit pattern 210 disposed on the third insulating layer 140.

Meanwhile, a third insulating portion is disposed under the first insulating portion. Unlike the second insulating portion, the third insulating portion has a plurality of insulating layer structures. Accordingly, in an exemplary embodiment, the electronic device 300 may have an asymmetric structure with respect to the first insulating portion on which the electronic device 300 is disposed. That is, in the conventional structure, the upper insulating portion and the lower insulating portion have a symmetrical structure (same layer structure) with respect to the insulating portion in which the electronic device 300 is disposed. On the contrary, in the embodiment, by applying a manufacturing process differentiated from the conventional manufacturing process, the second insulating portion and the third insulating portion have a mutually asymmetric structure with respect to the first insulating portion as described above.

The third insulating portion includes a plurality of insulating layers.

Preferably, the third insulating portion may include a fourth insulating layer 150 disposed under the first insulating layer 110, a fifth insulating layer 165 disposed under the fourth insulating layer 150, a sixth insulating layer 180 disposed under the firth insulating layer 165 and a seventh insulating layer 195 disposed under the sixth insulating layer 180.

In this case, the fourth insulating layer 150, the fifth insulating layer 165, the sixth insulating layer 180, and the seventh insulating layer 195 may be formed of different insulating materials. Preferably, the fifth insulating layer 165, the sixth insulating layer 180, and the seventh insulating layer 195 may be formed of the same insulating material. In addition, the fourth insulating layer 150 may be formed of an insulating material different from the fifth insulating layer 165, the sixth insulating layer 180, and the seventh insulating layer 195.

The fifth insulating layer 165, the sixth insulating layer 180, and the seventh insulating layer 195 may be formed of the same insulating material as the first insulating layer 110 and the second insulating layer 125.

The fifth insulating layer 165, the sixth insulating layer 180, and the seventh insulating layer 195 may include glass fiber or plastic. In detail, the fifth insulating layer 165, the sixth insulating layer 180, and the seventh insulating layer 195 may include glass or plastic. In detail, the first insulating layer 110 and the second insulating layer 125 include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, the fourth insulating layer 150 may be formed of a film-type resin. Preferably, the fourth insulating layer 150 may be formed of a film-type prepreg. Preferably, the fourth insulating layer 150 may be formed of an Aginomoto Build-up Film (ABF) or a photo Imagable Dielectric (PID) which is a photosensitive insulating material.

The fourth insulating layer 150 has a predetermined thickness and is disposed under the first insulating layer 110. In this case, there is no circuit pattern protruding from the lower surface of the first insulating layer 110. That is, the first circuit pattern 105 is formed by being buried in a lower part of the first insulating layer 110. Accordingly, the fourth insulating layer 150 may be formed without considering the thickness of the circuit pattern. That is, the general insulating layer is disposed for stable interlayer insulation while covering the circuit pattern, and for this purpose, the final thickness may be determined based on the thickness of the circuit pattern. For example, in the case of the third insulating layer 140, the thickness should be determined in consideration of the thickness of the third circuit pattern 135 disposed on the second insulating layer 125. That is, when the thickness of the third circuit pattern 135 is 12 μm, the thickness of the third insulating layer 140 may be 20 μm. In addition, when the thickness of the third insulating layer 140 is 10 μm, the thickness of the third insulating layer 140 may be 15 μm. On the other hand, the fourth insulating layer 150 may be formed without considering the thickness of the circuit pattern, and thus may be formed to have a thickness of about 10 μm.

That is, the thickness of the fourth insulating layer 150 is smaller than the thickness of each of the first insulating layer 110, the second insulating layer 125, the third insulating layer 140, the fifth insulating layer 165, the sixth insulating layer 180 and the seventh insulating layer 195.

A fifth circuit pattern 160 may be disposed on the lower surface of the fourth insulating layer 150. In addition, a fourth via 155a and a fifth via 155b may be formed in the fourth insulating layer 150.

In this case, the fifth circuit pattern 160 formed on the lower surface of the fourth insulating layer 150 may have a line width different from that of other circuit patterns. Preferably, the fifth circuit pattern 160 may have a smaller line width than circuit patterns disposed on other layers. Also, the fifth circuit pattern 160 may have a smaller pitch than circuit patterns disposed on other layers. This may be achieved by physical properties of the fifth insulating layer 165.

Meanwhile, a fourth via 155a and a fifth via 155b are formed in the fourth insulating layer 150. The fourth via 155a is a via directly connected to the terminal 310 of the electronic device 300, and the fifth insulating layer 165 is a via connected to the first circuit pattern 105. Preferably, the fourth via 155a may overlap with the electronic device 300 in a vertical direction, and the fifth via 155b may not overlap with the electronic device 300 in a vertical direction. In addition, the fourth via 155a and the fifth via 155b may have different widths. That is, a width of a via formed in the fourth insulating layer 150 may be formed smaller than that of a via formed in another layer. In this case, when all the vias disposed in the fourth insulating layer 150 are formed as small vias, a problem may occur in alignment with the vias disposed in other layers. In contrast, when all the vias disposed on the fourth insulating layer 150 are formed to have the same width as the vias disposed on other layers, reliability in a via connected to the terminal 310 of the electronic device 300 may be degraded. Accordingly, in the embodiment, the fourth via 155a and the fifth via 155b disposed in the same layer are formed to have different widths according to their respective functions. That is, as the fifth via 155b is connected to vias of another layer, the fifth via 155b may have the same width as the vias of the other layer. Vias disposed in the other layers may mean vias disposed in the first insulating layer 110, the second insulating layer 125, the third insulating layer 140, the fifth insulating layer 165, the sixth insulating layer 180, and the seventh insulating layer 195, respectively. Accordingly, the fifth via 155b may have a minimum width of 40 μm. Preferably, the fifth via 155b may have a width between 40 μm and 100 μm.

Meanwhile, the fourth via 155a is directly connected to the terminal 310 of the electronic device 300 so that it is formed as a small via. Preferably, the fourth via 155a has a width smaller than that of the fifth via 155b. For example, the fourth via 155a may have a width of 10 μm to 35 μm. For example, the fourth via 155a may have a width of 20 μm to 25 μm.

A sixth circuit pattern 170 is disposed on a lower surface of the fifth insulating layer 165. In addition, a sixth via 175 may be formed in the fifth insulating layer 165.

In addition, a seventh circuit pattern 185 is disposed on the sixth insulating layer 180. In addition, a seventh via 190 may be formed in the sixth insulating layer 180.

In addition, an eighth circuit pattern 200 is disposed on the seventh insulating layer 195. In addition, an eighth via 205 may be formed in the seventh insulating layer 195.

Meanwhile, a first protective layer 215 may be disposed on the third insulating layer 140. In addition, a second protective layer 220 may be disposed under the seventh insulating layer 195.

The first protective layer 215 and the second protective layer 220 may be formed of at least one or more layers using one or more of Solder Resist (SR), oxide, and Au.

According to an embodiment, the printed circuit board includes a first insulating portion in which a cavity in which an electronic device is disposed is formed. In addition, a circuit pattern or a pad is buried and disposed in the first insulating portion. Accordingly, as the circuit pattern or the pad is buried and disposed in the first insulating portion, the thickness of the printed circuit board can be reduced by the thickness of the circuit pattern compared to the prior art, and design freedom can be improved. In addition, since the first insulating portion uses a prepreg including glass fiber, it is possible to minimize the occurrence of panel cracking or warping that occurs when manufacturing a thin substrate.

Further, according to an embodiment, a second insulating portion is disposed under the first insulating portion of the printed circuit board. At this time, the second insulating portion is configured to form an insulating layer using a film-type resin (for example, ABF (Aginomoto Build-up Film) or PID (Photo Imagable Dielectric) which is a photosensitive insulating material) in a region in direct contact with the first insulating portion. Accordingly, in the embodiment, the thickness of the insulating layer of the second insulating portion may be reduced compared to the prior art, and design freedom may be improved.

In addition, according to an embodiment, a small via may be formed by forming the second insulating portion on the area in direct contact with the first insulating portion with a film-type resin, and thus a fine pattern may be implemented.

In addition, the prior art has a vertical symmetry structure as the chip is placed in the center. On the other hand, according to an embodiment, a fan pit panel level package structure may be implemented with an asymmetric structure.

Hereinafter, a process of manufacturing the printed circuit board shown in FIG. 1 will be described. The method of manufacturing a printed circuit board according to the embodiment may be included a first process for having a structure such that a first circuit pattern is buried and disposed in the first insulating layer 110, a second process of disposing the electronic device 300 in the first insulating portion, and a third process of laminating the second and third insulating portions having a vertical asymmetric structure with respect to the first insulating portion.

FIGS. 2 to 15 are views for illustrating a method of manufacturing the printed circuit board of FIG. 1 in order of processes.

Figure 2:
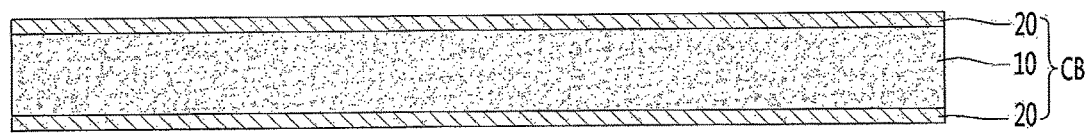
FIGS. 2 to 15 are views for illustrating a method of manufacturing the printed circuit board of FIG. 1 in order of processes.

Referring to FIG. 2, first, a carrier board CB for manufacturing a first insulating portion is prepared. The carrier board CB may be a substrate that is a basis for manufacturing a printed circuit board. The carrier board CB may have a structure in which metal layers 20 are formed on both surfaces of the support substrate 10 as the center.

The carrier board CB is a general support substrate, and may use CCL (Copper Claded Laminate).

Meanwhile, a surface treatment may be performed on the surface of the metal layer 20 of the carrier board CB to facilitate separation from the first insulating portion be performed later.

Figure 3:
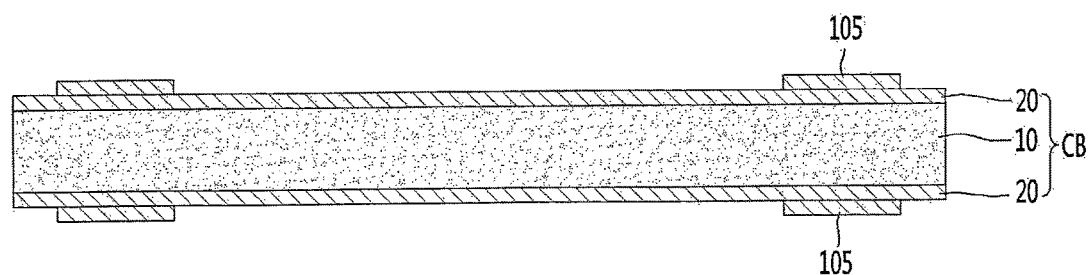

Next, referring to FIG. 3, a first circuit pattern 105 is formed on the carrier board CB. The first circuit patterns 105 may be formed on both surfaces of the carrier board CB.

The first circuit pattern 105 may be formed by plating a metal material on the metal layer 20 using the metal layer 20 as a seed layer. Alternatively, the first circuit pattern 105 may be formed by forming a plating layer (not shown) on the metal layer 20 and etching the formed plating layer.

The first circuit pattern 105 may be formed of at least one metal material selected from gold (Au), silver (Ag), platinum (Pt), titanium (Ti), tin (Sn), copper (Cu), and zinc (Zn). In addition, the first circuit pattern 105 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first circuit pattern 105 may be formed of copper (Cu) having high electrical conductivity and a relatively inexpensive price.

The first circuit pattern 105 can be formed by an additive process, a subtractive process, MSAP (Modified Semi Additive Process) and SAP (Semi Additive Process) method or the like, which are typical printed circuit board manufacturing processes, and a detailed description thereof will be omitted.

Figure 4:
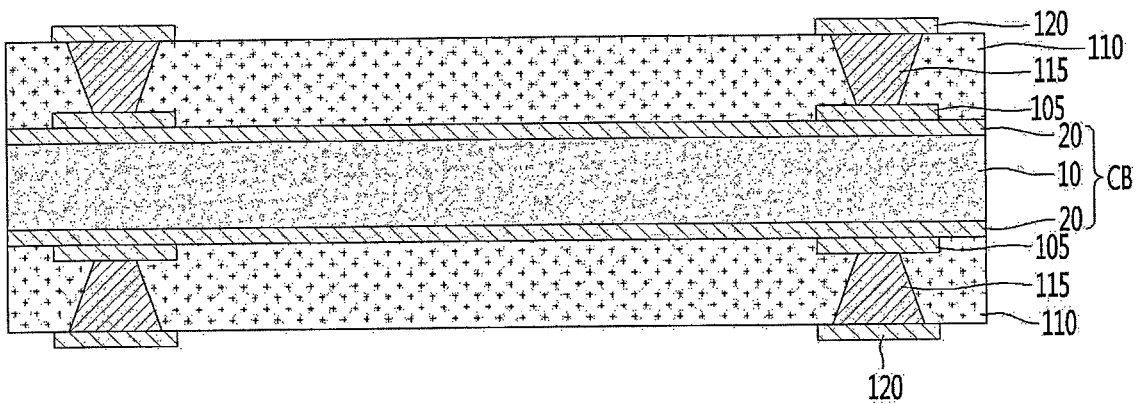

Next, referring to FIG. 4, a first insulating layer 110 is formed on the metal layer 20 on which the first circuit pattern 105 is formed. In this case, a copper foil layer may be present on the first insulating layer 110.

The first insulating layer 110 may be formed of a prepreg including glass fiber.

Preferably, the first insulating layer 110 include glass or plastic. In detail, the first insulating layer may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire. In addition, a first via 115 may be formed in the first insulating layer 110.

The first via 115 may be formed by filling a through hole (not shown) passing through the first insulating layer 110 with a conductive material. The through hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, at least one of plurality of insulating layers may be opened by using a chemical containing aminosilane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the first via 115 may be formed by filling the inside of the through hole with a conductive material. The metal material forming the first via 115 is selected from copper (Cu), silver (Ag), tin (Sn), gold (Au), nickel (Ni), and palladium (Pd), and the conductive material filling may use any one of electroless plating, electroplating, screen printing, sputtering, evaporation, ink jetting, and dispensing, or a combination thereof.

Next, when the first via 115 is formed, a second circuit pattern 120 may be formed on the upper surface of the first insulating layer 110.

In this case, the process of forming the first insulating layer 110, the first via 115, and the second circuit pattern 120 may be simultaneously performed on both sides of the carrier board CB.

Figure 5:
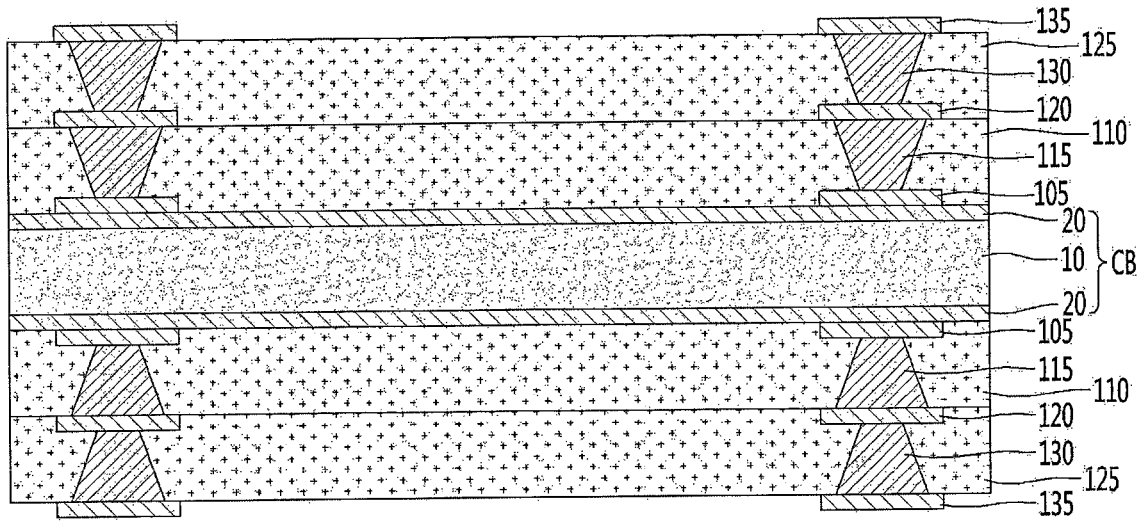

Next, referring to FIG. 5, a second insulating layer 125 is laminated on the first insulating layer 110. In addition, a second via 120 is formed in the second insulating layer 125. In addition, a third circuit pattern 135 is formed on the upper surface of the second insulating layer 125. In this case, the second insulating layer 125 may be formed of a prepreg including the same glass fiber as the first insulating layer 110.

In this case, the process of forming the second insulating layer 125, the second via 120, and the third circuit pattern 135 may be simultaneously performed on both sides of the carrier board CB.

Figure 6:
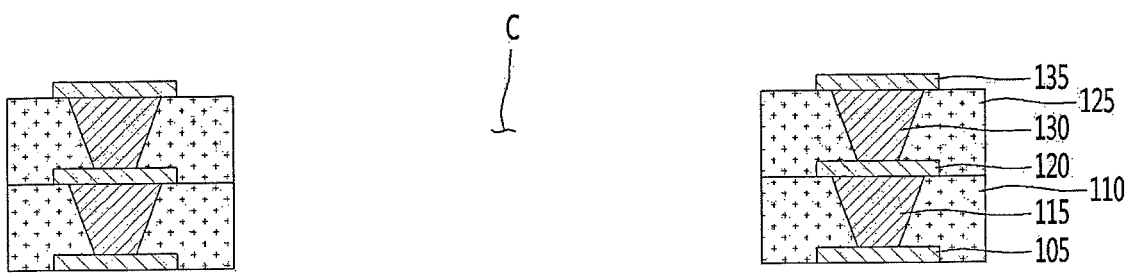

Next, referring to FIG. 6, a process of separating the first insulating portions respectively formed above and below the carrier board CB may be performed. Accordingly, in an embodiment, a plurality of first insulating portions may be simultaneously manufactured in a single process. In addition, according to an embodiment, the first circuit pattern 105 may be buried in a lower part of the first insulating layer 110. A second circuit pattern 120 may be disposed on the upper surface of the first insulating layer 110. Also, a third circuit pattern 135 may be disposed on the upper surface of the second insulating layer 125. In this case, when the first insulating layer 110 and the second insulating layer 125 are viewed as one insulating layer, a lower circuit pattern disposed under the insulating layer is buried and disposed in the insulating layer, and an upper circuit pattern disposed above the insulating layer is disposed to protrude on the insulating layer. That is, in the related art, both the upper and lower circuit patterns are formed to protrude from the upper and lower surfaces of the insulating layer. On the contrary, in the embodiment, the first circuit pattern 105 may be buried in a lower part of the first insulating layer 110. Accordingly, in the embodiment, the thickness of the insulating layer (to be described later) 150 disposed under the first insulating layer 110 can be reduced by the thickness of the first circuit pattern 105. That is, basically, since the insulating layer is disposed while covering the circuit pattern, the thickness of the circuit pattern is determined as the basic offset thickness. On the other hand, in the embodiment, as the first circuit pattern 105 is buried and disposed in a lower part of the first insulating layer 110, the thickness of the insulating layer to be laminated under the first insulating layer 110 may be reduced by about 12 to 18 µm compared to the prior art.

When the first insulating portion is manufactured, a cavity C may be formed in the first insulating portion. The cavity C may be formed through the first insulating layer 110 and the second insulating layer 125 in common. That is, the cavity C may have the same thickness as the electronic device 300, and may have a thickness greater than the thickness of the electronic device 300 to improve reliability. Preferably, the cavity C may have a thickness greater than that of the electronic device 300 by about 10 µm. Accordingly, the upper surface of the electronic device 300 may be positioned lower than the upper surface of the second insulating layer 125. In addition, the width of the cavity C may have a greater width than the width of the electronic device 300 for stable arrangement of the electronic device 300. The cavity C may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, the first insulating layer 110 and the second insulating layer 125 may be opened using a chemical containing aminosilane, ketones, or the like.

Figure 7:
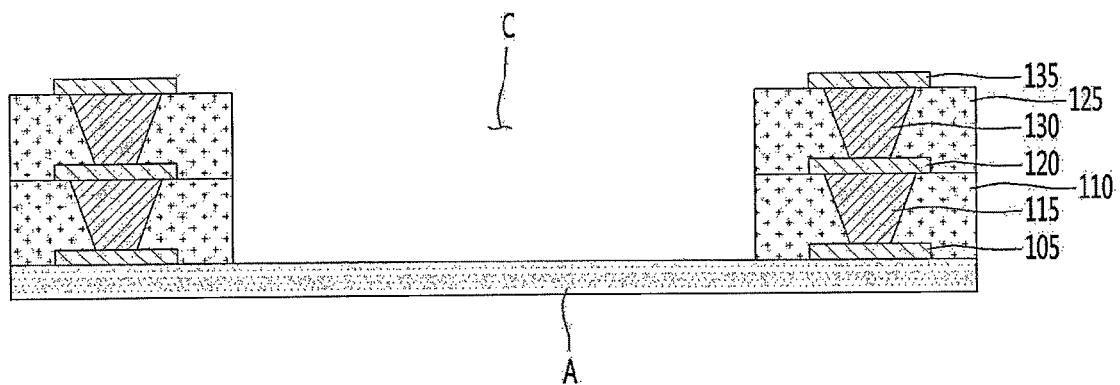

Next, referring to FIG. 7, a film layer A is formed under the lower surface of the first insulating layer 110. The film layer (A) is attached to the lower surface of the first insulating layer 110, and accordingly may be disposed to cover a lower part of the cavity (C). The film layer (A) may be disposed covering one surface of the cavity (C) in order to arrange and fix the electronic device 300 in the cavity (C). The film layer (A) may be a polyimide film, but is not limited thereto.

Figure 8:
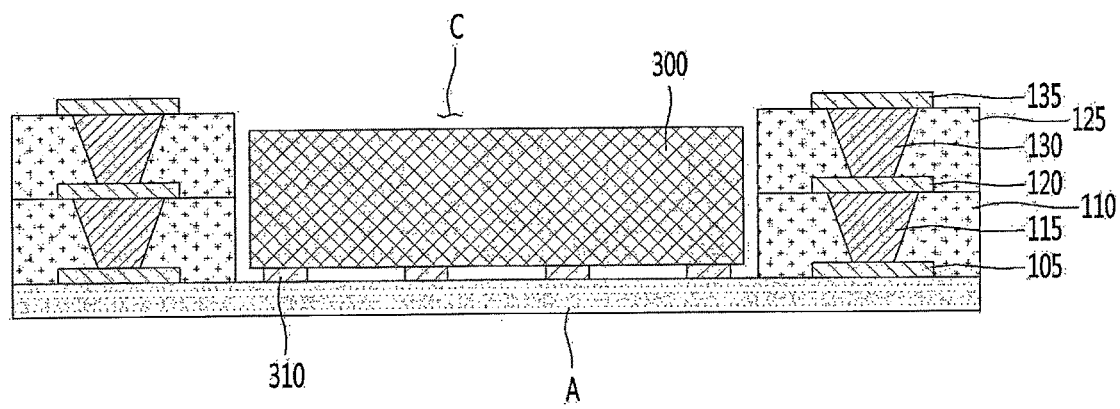

Next, referring to FIG. 8, the electronic device 300 is attached on the film layer A exposed through one surface of the cavity C. The electronic device 300 may be an electronic component such as a chip, and may be divided into an active device and a passive device. In addition, the active device is a device that actively uses a non-linear part, and the passive device refers to a device that does not use non-linear characteristics even though both linear and non-linear characteristics exist. In addition, the passive device may include a transistor, an IC semiconductor chip, and the like, and the passive device may include a capacitor, a resistor, and an inductor. The passive element is mounted on a conventional printed circuit board to increase a signal processing speed of a semiconductor chip, which is an active element, or to perform a filtering function.

The electronic device 300 may vary depending on the application to which the printed circuit board is applied. For example, when applied to a NAND flash memory product applied to a smartphone, the electronic device 300 may be a control device component.

A terminal 310 may be formed on a lower surface of the electronic device 300. In this case, a lower surface of the terminal 310 may be disposed on the same plane as the lower surface of the first insulating layer 110. The lower surface of the terminal 310 may be disposed on the same plane as the lower surface of the first circuit pattern 105. Meanwhile, the upper surface of the electronic device 300 may be disposed on the same plane as the upper surface of the second insulating layer 125. Preferably, the upper surface of the electronic device 300 may be disposed lower than the upper surface of the second insulating layer 125. That is, the cavity C may have the same thickness as the electronic device 300, and may have a thickness greater than the thickness of the electronic device 300 to improve reliability. Preferably, the cavity C may have a thickness greater than that of the electronic device 300 by about 10 µm. Accordingly, the upper surface of the electronic device 300 may be positioned lower than the upper surface of the second insulating layer 125. In addition, the width of the cavity C may have a greater width than the width of the electronic device 300 for stable arrangement of the electronic device 300.

Figure 9:
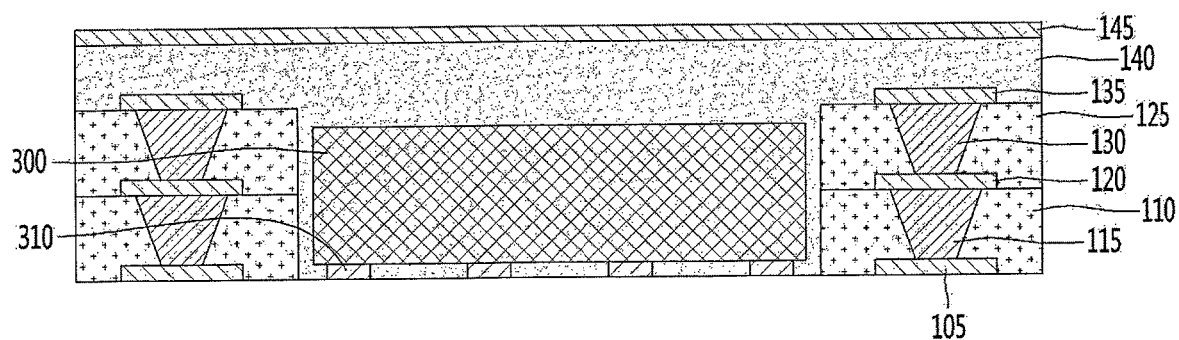

Next, referring to FIG. 9, a second insulating portion is formed on the first insulating portion. That is, when the arrangement process of the electronic device 300 is completed, the third insulating layer 140 is formed on the second insulating layer 125. The third insulating layer 140 may be formed of Resin Coated Cu (RCC). In this case, the third insulating layer 140 is disposed on the second insulating layer 125 and is also disposed in the cavity C formed in the second insulating layer 125 and the first insulating layer 110. That is, the third insulating layer 140 may be disposed on the second insulating layer 125 to have a predetermined thickness while filling the cavity C.

That is, as described above, the third insulating layer 140 must be disposed on the second insulating layer 125 with a uniform thickness while stably filling the cavity C. In this case, a curvature may be formed on the upper surface of the third insulating layer 140 according to the area of the cavity C. This is because the thickness of the third insulating layer 140 in the region where the cavity C exists and the region other than the region are different from each other. Accordingly, in an embodiment, by forming the third insulating layer 140 in the RCC type as described above, while solving the above problems, it is possible to manufacture a reliable substrate.

In addition, a coating layer 145 coated with copper may be formed on the third insulating layer 140. The coating layer 145 may be a metal layer for later forming the fourth circuit pattern 210.

In addition, when the formation of the third insulating layer 140 is completed, the film layer A attached under the second insulating layer 125 is removed.

Figure 10:
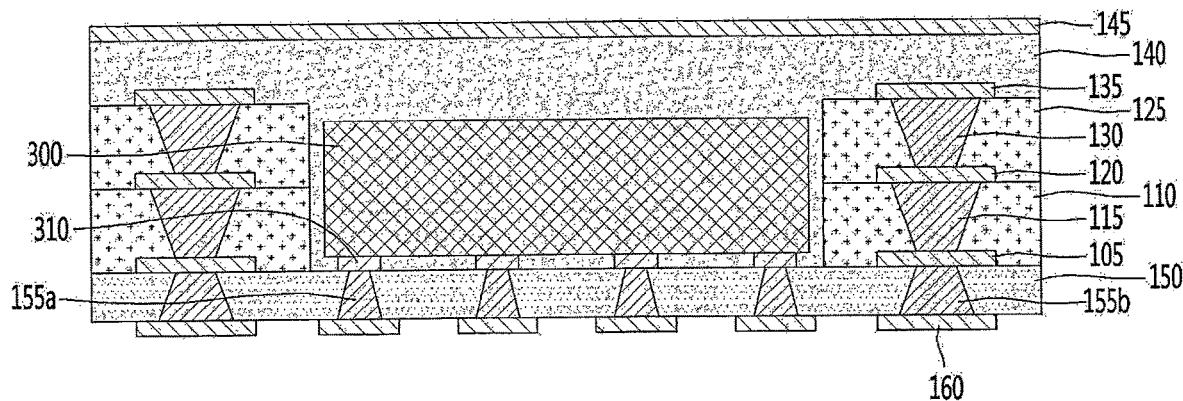

Next, referring to FIG. 10, a fourth insulating layer 150 is formed under the first insulating layer 110. In this case, the fourth insulating layer 150 may be formed of an insulating material different from the first insulating layer 110, the second insulating layer 125, and the third insulating layer 140. Preferably, the fourth insulating layer 150 may be formed of a film-type resin. Preferably, the fourth insulating layer 150 may be formed of a film-type prepreg. Preferably, the fourth insulating layer 150 may be formed of an Agi-nomoto Build-up Film (ABF) or a photo Imagable Dielectric (PID) which is a photosensitive insulating material.

The fourth insulating layer 150 has a predetermined thickness and is disposed under the first insulating layer 110. In this case, there is no circuit pattern protruding from the lower surface of the first insulating layer 110. That is, the first circuit pattern 105 is formed by being buried in a lower part of the first insulating layer 110. Accordingly, the fourth insulating layer 150 may be formed without considering the thickness of the circuit pattern. That is, the general insulating layer is disposed for stable interlayer insulation while covering the circuit pattern, and for this purpose, the final thickness may be determined based on the thickness of the circuit pattern. For example, in the case of the third insulating layer 140, the thickness should be determined in consideration of the thickness of the third circuit pattern 135 disposed on the second insulating layer 125. That is, when the thickness of the third circuit pattern 135 is 12 μm, the thickness of the third insulating layer 140 may be 20 μm. In addition, when the thickness of the third insulating layer 140 is 10 μm, the thickness of the third insulating layer 140 may be 15 μm. On the other hand, the fourth insulating layer 150 may be formed without considering the thickness of the circuit pattern, and thus may be formed to have a thickness of about 10 μm.

That is, the thickness of the fourth insulating layer 150 may be smaller than the thickness of each of the first insulating layer 110, the second insulating layer 125, and the third insulating layer 140.

Next, a fifth circuit pattern 160 may be formed on the lower surface of the fourth insulating layer 150. In addition, a fourth via 155a and a fifth via 155b may be formed in the fourth insulating layer 150, respectively.

In this case, the fifth circuit pattern 160 formed on the lower surface of the fourth insulating layer 150 may have a line width different from that of other circuit patterns. Preferably, the fifth circuit pattern 160 may have a smaller line width than circuit patterns disposed on other layers. Also, the fifth circuit pattern 160 may have a smaller pitch than circuit patterns disposed on other layers. This may be achieved by physical properties of the fifth insulating layer 165.

Meanwhile, a fourth via 155a and a fifth via 155b are formed in the fourth insulating layer 150. The fourth via 155a is a via directly connected to the terminal 310 of the electronic device 300, and the fifth insulating layer 165 is a via connected to the first circuit pattern 105. Preferably, the fourth via 155a may overlap with the electronic device 300 in a vertical direction, and the fifth via 155b may not overlap with the electronic device 300 in a vertical direction. In addition, the fourth via 155a and the fifth via 155b may have different widths. That is, a width of a via formed in the fourth insulating layer 150 may be formed smaller than that of a via formed in another layer. In this case, when all the vias disposed in the fourth insulating layer 150 are formed as small vias, a problem may occur in alignment with the vias disposed in other layers. In contrast, when all the vias disposed on the fourth insulating layer 150 are formed to have the same width as the vias disposed on other layers, reliability in a via connected to the terminal 310 of the electronic device 300 may be degraded. Accordingly, in the embodiment, the fourth via 155a and the fifth via 155b disposed in the same layer are formed to have different widths according to their respective functions. That is, as the fifth via 155b is connected to vias of another layer, the fifth via 155b may have the same width as the vias of the other layer. Vias disposed in the other layers may mean vias disposed in the first insulating layer 110, the second insulating layer 125, the third insulating layer 140, the fifth insulating layer 165, the sixth insulating layer 180, and the seventh insulating layer 195, respectively. Accordingly, the fifth via 155b may have a minimum width of 40 μm. Preferably, the fifth via 155b may have a width between 40 μm and 100 μm.

Meanwhile, the fourth via 155a is directly connected to the terminal 310 of the electronic device 300 so that it is formed as a small via. Preferably, the fourth via 155a has a width smaller than that of the fifth via 155b. For example, the fourth via 155a may have a width of 10 μm to 35 μm. For example, the fourth via 155a may have a width of 20 μm to 25 μm.

Thereafter, a build-up process may be performed in which an additional insulating layer is laminated on the third insulating layer 140 and under the fourth insulating layer 150, respectively. In this case, in the embodiment, the second insulating portion and the third insulating portion are arranged with an asymmetric structure with respect to the first insulating portion. Accordingly, the number of layers of the second insulating portion and the number of layers of the third insulating portion may be different. This can be achieved by the process described later.

Figure 11:
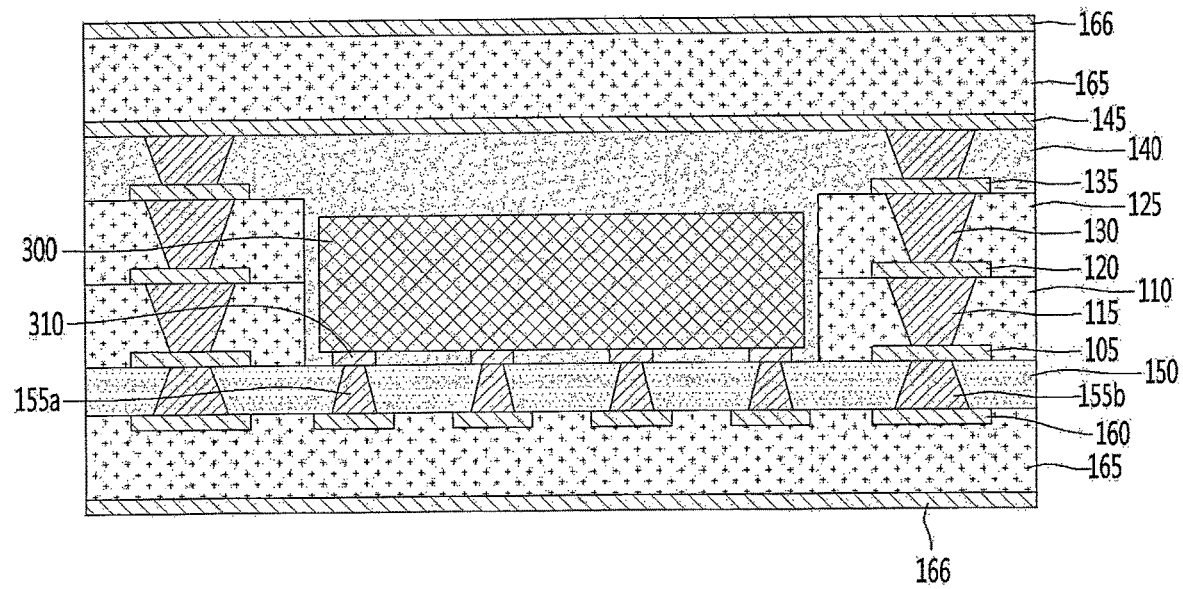

Referring to FIG. 11, a fifth insulating layer 165 is laminated on the third insulating layer 140 and under the fourth insulating layer 150, respectively. In this case, a metal layer 166 may be formed on a surface of the fifth insulating layer 165.

Figure 12:
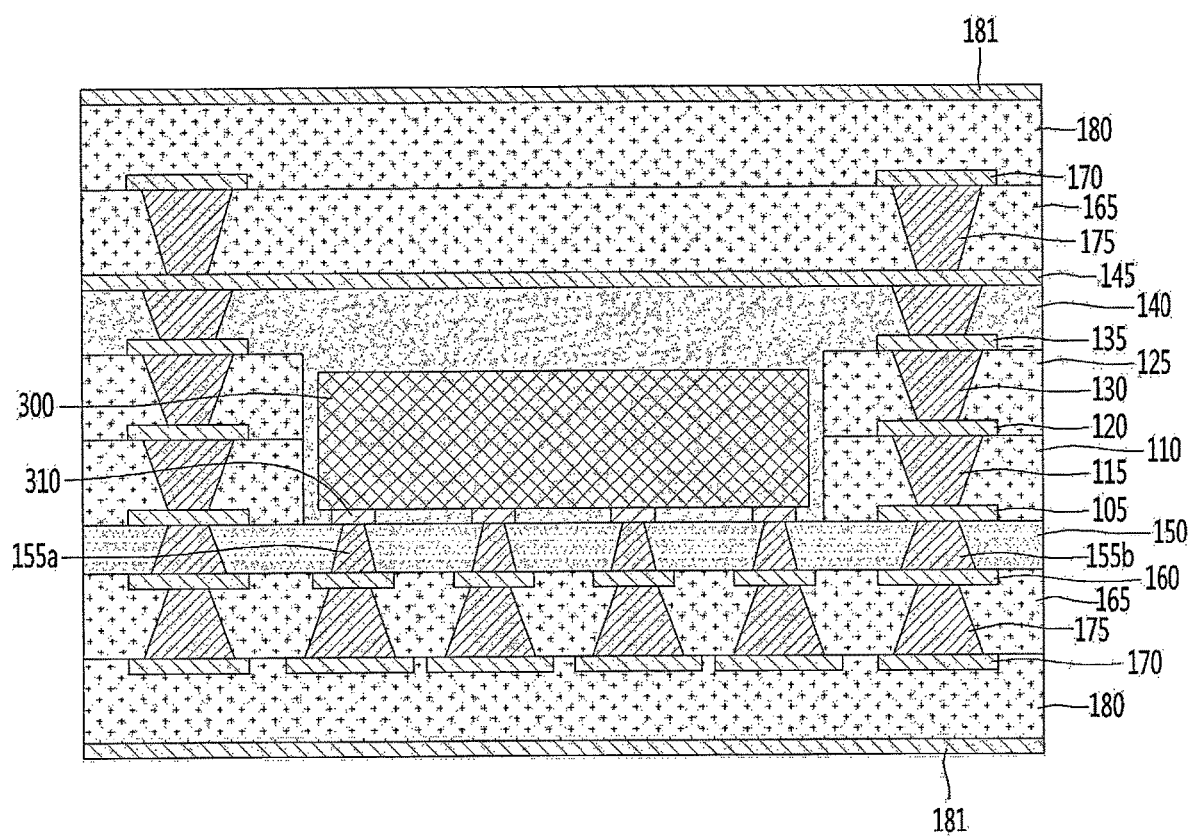

Next, referring to FIG. 12, a process of forming the sixth via 175 in the fifth insulating layer 165 may be performed. In addition, a process of forming the sixth circuit pattern 170 on the surface of the fifth insulating layer 165 may be performed using the metal layer 166.

Thereafter, when the formation of the sixth via 175 and the sixth circuit pattern 170 is completed, a process of laminating the sixth insulating layer 180 on the fifth insulating layer 165 may be performed. In this case, the metal layer 181 may also be disposed on the surface of the sixth insulating layer 180.

Figure 13:
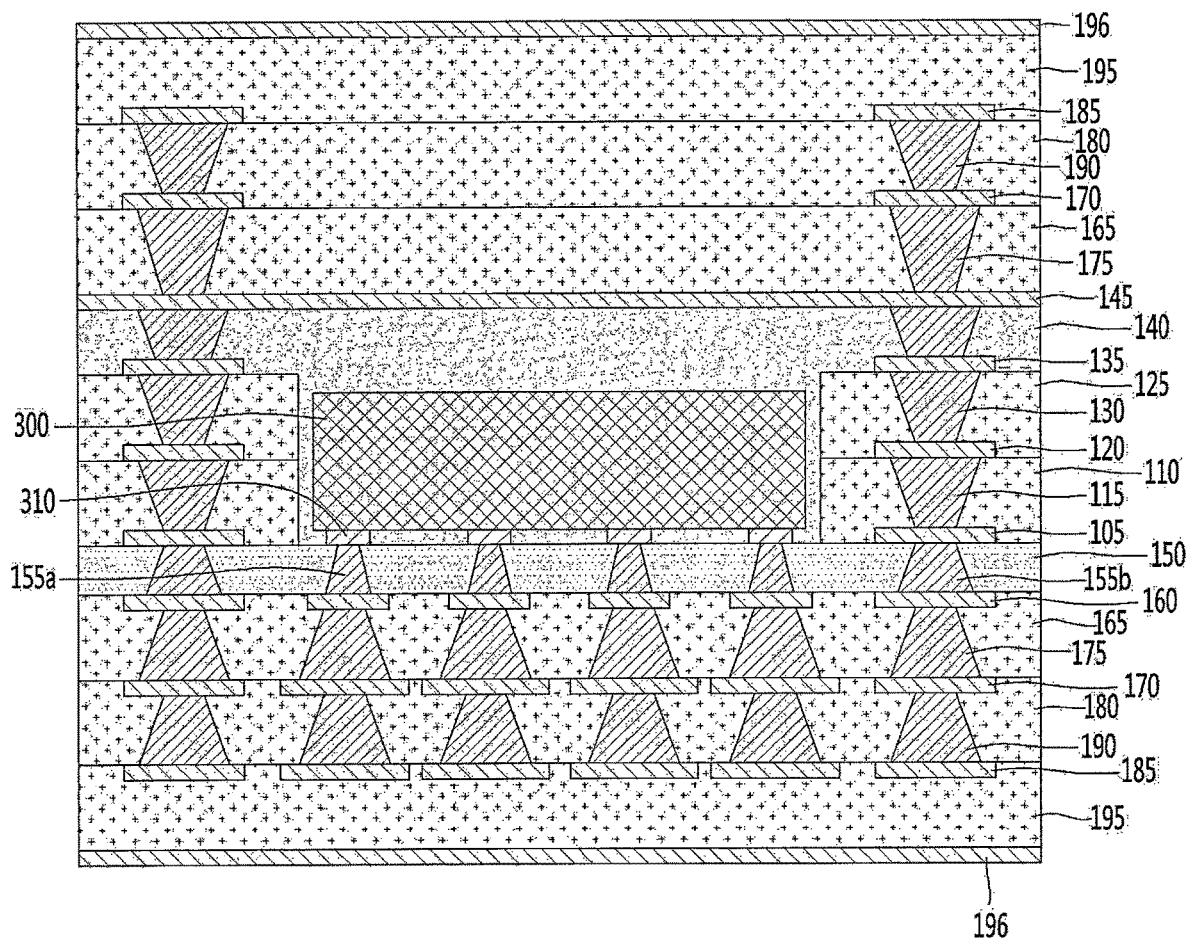

Next, referring to FIG. 13, a process of forming the seventh via 190 in the sixth insulating layer 180 may be performed. In addition, a process of forming the seventh circuit pattern 185 by removing the metal layer 181 may be performed.

Thereafter, when the formation of the seventh via 190 and the seventh circuit pattern 185 is completed, a process of laminating the seventh insulating layer 195 on the sixth insulating layer 180 may be performed. In this case, the metal layer 196 may also be disposed on the surface of the seventh insulating layer 195.

In this case, the laminating process of the fifth insulating layer 165, the sixth insulating layer 180, and the seventh insulating layer 195 was performed at an upper part of the third insulating layer 140 and a lower part of the fourth insulating layer 150, respectively. In addition, the fifth insulating layer 165, the sixth insulating layer 180, and the seventh insulating layer 195 formed on the third insulating layer 140 are dummy insulating portions to be removed. The fifth insulating layer 165, the sixth insulating layer 180, and the seventh insulating layer 195 formed on the third insulating layer 140 are dummy insulating portions for forming an asymmetric structure according to the embodiment.

Figure 14:
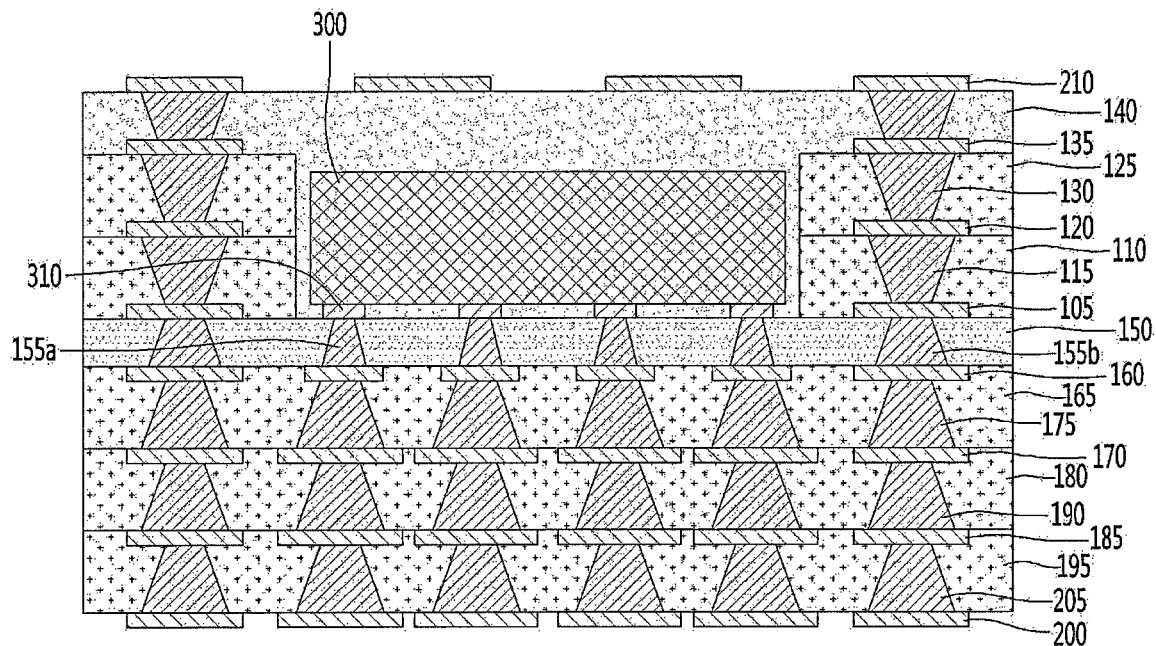

And, referring to FIG. 14, while maintaining the fifth insulating layer 165, the sixth insulating layer 180, and the seventh insulating layer 195 formed under the fourth insulating layer 150, a process of removing the fifth insulating layer 165, the sixth insulating layer 180, and the seventh insulating layer 195 formed on the third insulating layer 140 may be performed.

Thereafter, a process of forming the eighth via 205 and the eighth circuit pattern 200 in the seventh insulating layer 195 may be performed.

In addition, a process of forming the via and the fourth circuit pattern 210 in the third insulating layer 140 may be performed.

That is, in the embodiment, the number of layers of the second insulating portion on the first insulating portion and the number of layers of the third insulating portion under the first insulating portion are different from each other by using the dummy insulating portion as described above, and this makes it possible to have a mutually asymmetric structure.

Figure 15:
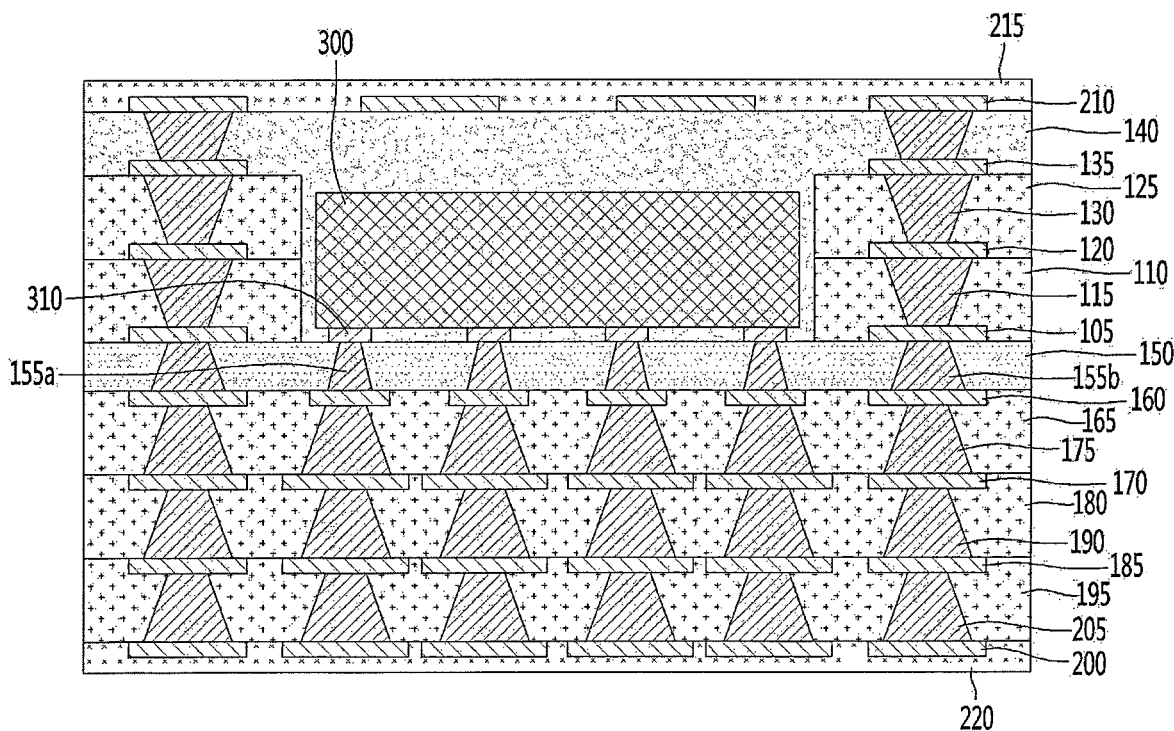

Next, referring to FIG. 15, a process of disposing the first protective layer 215 on the third insulating layer 140, and a process of disposing the second protective layer 220 under the seventh insulating layer 195 may be performed.

The first protective layer 215 and the second protective layer 220 may be formed of at least one or more layers using one or more of Solder Resist (SR), oxide, and Au.

According to an embodiment, the printed circuit board includes a first insulating portion in which a cavity in which an electronic device is disposed is formed. In addition, a circuit pattern or a pad is buried and disposed in the first insulating portion. Accordingly, as the circuit pattern or the pad is buried and disposed in the first insulating portion, the thickness of the printed circuit board can be reduced by the thickness of the circuit pattern compared to the prior art, and design freedom can be improved. In addition, since the first insulating portion uses a prepreg including glass fiber, it is possible to minimize the occurrence of panel cracking or warping that occurs when manufacturing a thin substrate.

Further, according to an embodiment, a second insulating portion is disposed under the first insulating portion of the printed circuit board. At this time, the second insulating portion is configured to form an insulating layer using a film-type resin (for example, ABF (Aginomoto Build-up Film) or PID (Photo Imagable Dielectric) which is a photosensitive insulating material) in a region in direct contact with the first insulating portion. Accordingly, in the embodiment, the thickness of the insulating layer of the second insulating portion may be reduced compared to the prior art, and design freedom may be improved.

In addition, according to an embodiment, a small via may be formed by forming the second insulating portion on the area in direct contact with the first insulating portion with a film-type resin, and thus a fine pattern may be implemented.

In addition, the prior art has a vertical symmetry structure as the chip is placed in the center. On the other hand, according to an embodiment, a fan pit panel level package structure may be implemented with an asymmetric structure.

Figure 16:
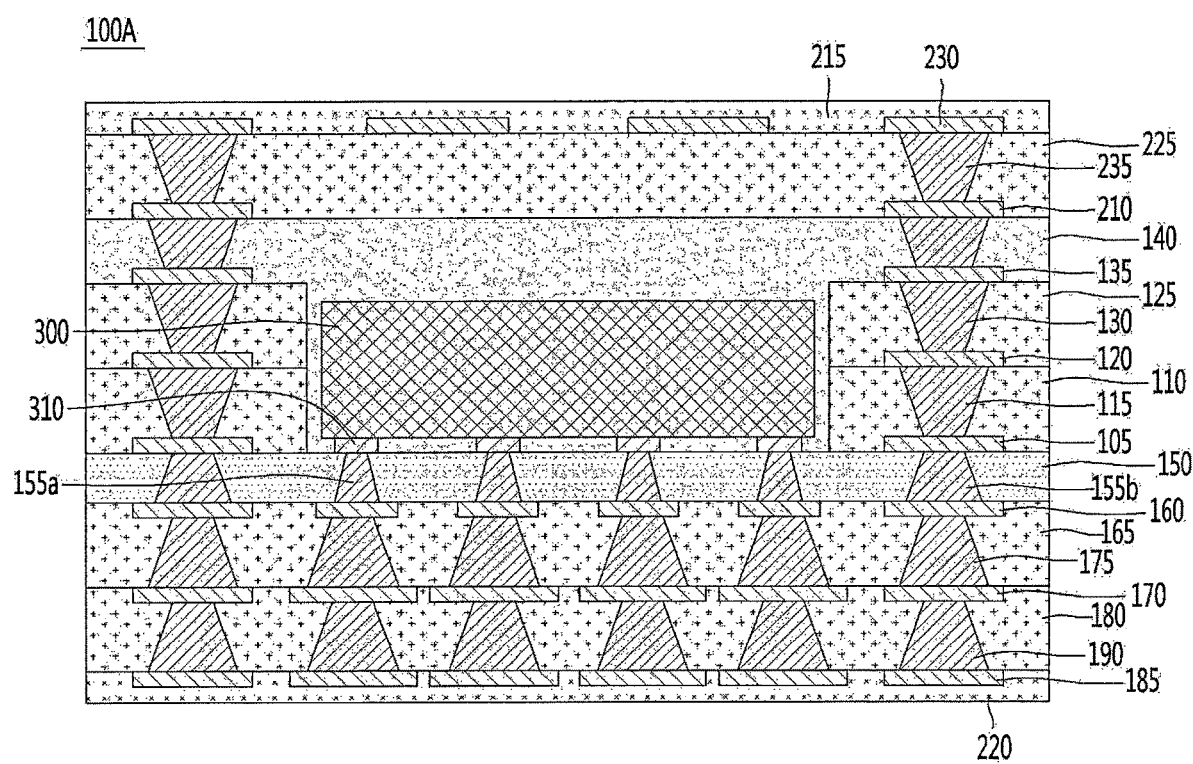
FIG. 16 is a view illustrating a structure of a printed circuit board according to another embodiment.

FIG. 16 is a view illustrating a structure of a printed circuit board according to another embodiment.

Referring to FIG. 16, the printed circuit board 100A differs only in the number of layers of the second insulating portion and the number of layers of the third insulating portion compared to the printed circuit board 100 of FIG. 1, and other configurations may be the same.

The printed circuit board 100A may include a first insulating portion, a second insulating portion on the first insulating portion, and a third insulating portion under the first insulating portion. In this case, the basic structures of the first insulating portion, the second insulating portion, and the third insulating portion have been described in FIG. 1, and thus detailed descriptions thereof will be omitted.

In this case, the second insulating portion may have a two-layer structure different from the second insulating portion of FIG. 1. That is, the second insulating portion may further include a third insulating layer 140 and a third-first insulating layer 225 disposed on the third insulating layer 140. In addition, a via 235 may be disposed in the third-first insulating layer 225. In addition, a fourth-first circuit pattern 230 may be additionally disposed on the third-first insulating layer 225.

In addition, the third insulating portion may have a three-layer structure different from the third insulating portion in FIG. 1.

That is, the third insulating portion may have a structure including the fourth insulating layer 150, the fifth insulating layer 165, and the sixth insulating layer 180.

That is, according to FIG. 16, with the first insulating portion as the center, the second insulating portion disposed above may have a two-layer structure, and the third insulating portion disposed below may have a three-layer structure.

Figure 17:
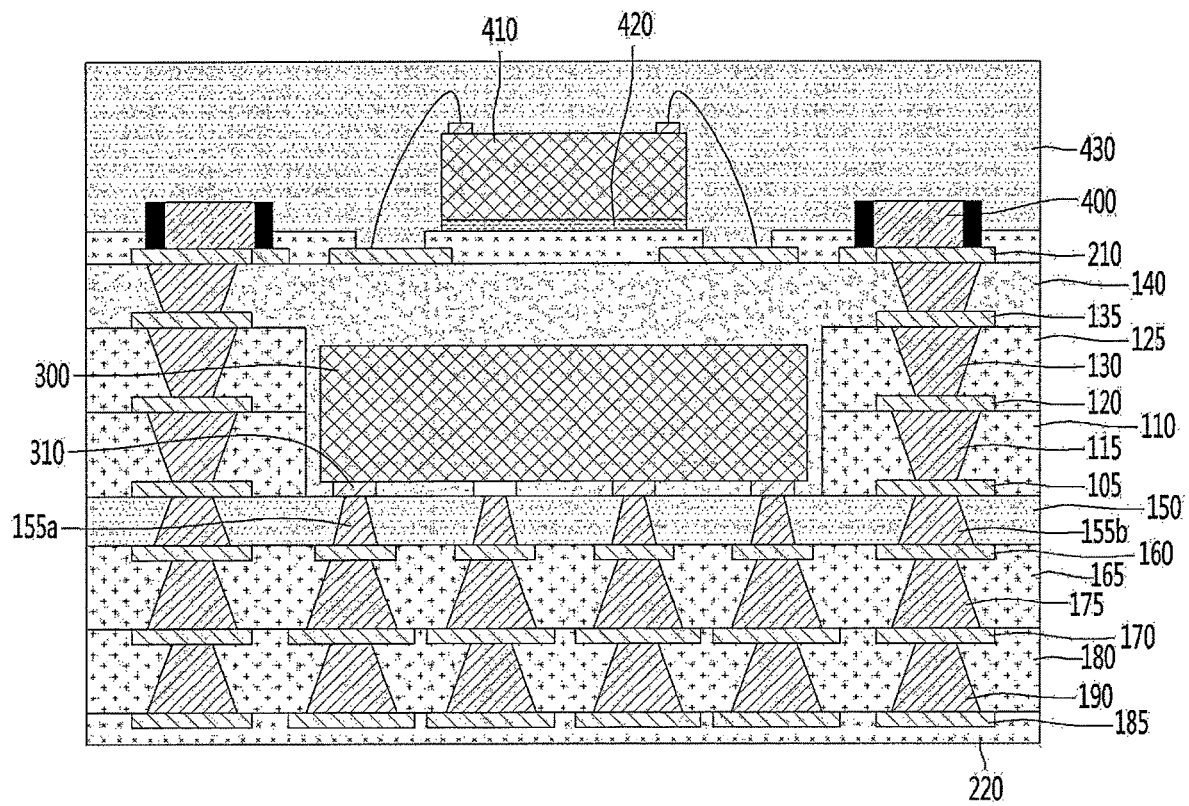
FIG. 17 is a view illustrating a package substrate according to an embodiment.

FIG. 17 is a view illustrating a package substrate according to an exemplary embodiment.

Referring to FIG. 17, the package substrate may include the printed circuit board 100 described in FIG. 1. In this case, the first electronic device 300 may be disposed in the printed circuit board 100.

In addition, the second electronic device 400 may be attached on the circuit pattern 210 disposed on an uppermost portion of the printed circuit board 100.

In addition, a third electronic device 410 electrically connected to the circuit pattern 210 and a connection wire (e.g., a metal wire) may be further formed on the uppermost portion of the printed circuit board 100.

To this end, the first protective layer 215 may include at least one opening (not shown) exposing an upper surface of the circuit pattern 210 disposed on the uppermost portion. In addition, the second electronic device 400 may be attached on the circuit pattern 210 exposed through the opening by a flip chip bonding method.

In addition, an adhesive layer 420 may be disposed on the first protective layer 215.

The adhesive layer 420 may be formed of a conductive adhesive, and differently, may be a non-conductive adhesive. The conductive adhesive is largely divided into an anisotropic conductive adhesive and an isotropic conductive adhesive, and it is basically composed of conductive particles such as Ni, Au/polymer, or Ag, and a blend type insulating resin in which the properties of thermosetting, thermoplastic, or both are mixed.

In addition, the non-conductive adhesive may be a polymer adhesive, and preferably, a non-conductive polymer adhesive including a thermosetting resin, a thermoplastic resin, a filler, a curing agent, and a curing accelerator.

In addition, a third electronic device 410 may be attached on the adhesive layer 420. In this case, a terminal (not shown) may be disposed on the third electronic device 410. In this case, the third electronic device 410 may be attached on the adhesive layer 420 while the terminal of the third electronic device 410 is disposed to face upward. In addition, the terminal of the third electronic device 410 and the circuit pattern 210 may be electrically connected through an additional connection wire such as a metal wire.

At this time, each of the first electronic device 300, the second electronic device 400, and the third electronic device 410 may include at least one of a control IC chip, a memory chip, a diode chip, a power IC chip, a touch sensor IC chip, an MLCC chip, a BGA chip and a chip capacitor.

For example, when the package substrate is a NAND flash memory product applied to a smartphone, the first electronic device 300 may be a control IC chip, the second electronic device 400 is a NAND flash memory, and the third electronic device 410 may be at least one of a diode chip, a power IC chip, a touch sensor IC chip, an MLCC chip, a BGA chip, and a chip capacitor.

Figure 18:
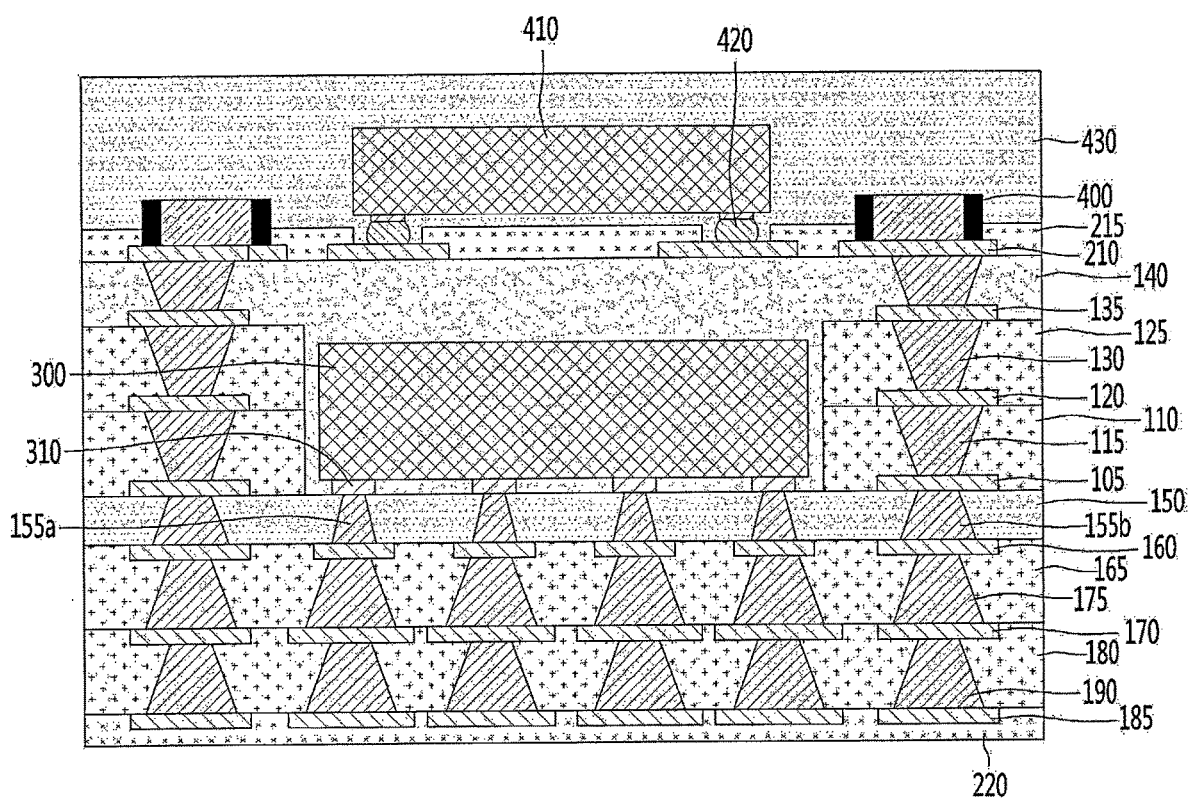
FIG. 18 is a view illustrating a package substrate according to another embodiment.

FIG. 18 is a view illustrating a package substrate according to another embodiment.

Referring to FIG. 18, the package substrate may include the printed circuit board 100 described in FIG. 1. In this case, the first electronic device 300 may be disposed in the printed circuit board 100.

In addition, the second electronic device 400 may be attached on the circuit pattern 210 disposed on the uppermost portion of the printed circuit board 100.

In addition, a circuit pattern 210 and a third electronic device 410 may be further attached to the uppermost portion of the printed circuit board 100.

To this end, the first protective layer 215 may include a plurality of openings (not shown) exposing an upper surface of the circuit pattern 210 disposed on the uppermost portion. In addition, the second electronic device 400 may be attached on the circuit pattern 210 exposed through the opening by a flip chip bonding method.

In addition, a third electronic device 410 may be attached on the exposed circuit pattern 210 by a flip chip bonding method.

To this end, a solder ball 420 may be formed between the third electronic device 410 and the circuit pattern 210. The solder ball 420 may contain materials of different components in solder. The solder may be composed of at least one of SnCu, SnPb, and SnAgCu. In addition, the material of the different component may include any one of Al, Sb, Bi, Cu, Ni, In, Pb, Ag, Sn, Zn, Ga, Cd, and Fe.

In addition, although not shown in FIGS. 17 and 18, a conductive adhesive portion (not shown) such as the solder ball is also disposed between the second electronic device 400 and the circuit pattern 210, and accordingly, the second electronic device 400 may be attached to the circuit pattern 210.

According to an embodiment, the printed circuit board includes a first insulating portion in which a cavity in which an electronic device is disposed is formed. In addition, a circuit pattern or a pad is buried and disposed in the first insulating portion. Accordingly, as the circuit pattern or the pad is buried and disposed in the first insulating portion, the thickness of the printed circuit board can be reduced by the thickness of the circuit pattern compared to the prior art, and design freedom can be improved. In addition, since the first insulating portion uses a prepreg including glass fiber, it is possible to minimize the occurrence of panel cracking or warping that occurs when manufacturing a thin substrate.

Further, according to an embodiment, a second insulating portion is disposed under the first insulating portion of the printed circuit board. At this time, the second insulating portion is configured to form an insulating layer using a film-type resin (for example, ABF (Aginomoto Build-up Film) or PID (Photo Imagable Dielectric) which is a photosensitive insulating material) in a region in direct contact with the first insulating portion. Accordingly, in the embodiment, the thickness of the insulating layer of the second insulating portion may be reduced compared to the prior art, and design freedom may be improved.

In addition, according to an embodiment, a small via may be formed by forming the second insulating portion on the area in direct contact with the first insulating portion with a film-type resin, and thus a fine pattern may be implemented.

In addition, the prior art has a vertical symmetry structure as the chip is placed in the center. On the other hand, according to an embodiment, a fan pit panel level package structure may be implemented with an asymmetric structure.

Features, structures, effects, and the like described in the embodiments above are included in at least one embodiment, and are not necessarily limited to only one embodiment. Furthermore, the features, structures, effects, and the like illustrated in each embodiment may be combined or modified for other embodiments by a person having ordinary knowledge in the field to which the embodiments belong. Therefore, the contents related to these combinations and modifications should be construed as being included in the scope of the embodiment.

In the above, the embodiments have been described mainly, but these are only examples and are not intended to limit the embodiments, and those of ordinary skill in the field to which the embodiment belongs will appreciate that various modifications and applications not illustrated above are possible without departing from the essential characteristics of the embodiment. For example, each component specifically shown in the embodiment can be modified and implemented. And differences related to these modifications and applications should be construed as being included in the scope of the embodiments set in the appended claims.

The invention claimed is:

1. A circuit board comprising:
a first insulating layer including a cavity;
a connection member embedded in the cavity of the first insulating layer; and
a second insulating layer disposed on the first insulating layer and the connection member, wherein the first insulating layer includes a lower insulating layer overlapping the connection member in a horizontal direction, and an upper insulating layer disposed on the lower insulating layer and overlapping the connection member in the horizontal direction, wherein the second insulating layer includes a portion disposed on an upper surface of the upper insulating layer, wherein a thickness of the portion of the second insulating layer in a vertical direction is smaller than a thickness of the lower insulating layer in the vertical direction and a thickness of the upper insulating layer in the vertical direction.

2. The circuit board of claim 1, comprising:

a first via electrode passing through at least a portion of the lower insulating layer and overlapping the connection member in the horizontal direction, and a second via electrode passing through at least a portion of the upper insulating layer and including a portion overlapping the connection member along the horizontal direction.

3. The circuit board of claim 2, wherein the first via electrode has a side surface inclined in an inclined direction in which a width in the horizontal direction changes toward the second insulating layer, and wherein a side surface of the portion of the second via electrode is inclined in a same direction as the side surface of the first via electrode is inclined.

4. The circuit board of claim 2, comprising:

an intermediate wiring layer disposed between the first via electrode and the portion of the second electrode, and wherein the intermediate wiring layer overlaps the connection member along the horizontal direction.

5. The circuit board of claim 2, comprising:

a third via electrode passing through at least a portion of the second insulating layer and overlapping the connection member along the vertical direction, and wherein a width of the third via electrode in the horizontal direction is different from a width of the first via electrode in the horizontal direction and a width of the portion of the second via electrode in the horizontal direction.

6. The circuit board of claim 5, wherein the width of the third via electrode in the horizontal direction is smaller than the width of the first via electrode in the horizontal direction and the width of the portion of the second via electrode in the horizontal direction.

7. The circuit board of claim 5, comprising:

a fourth via electrode passing through at least a portion of the portion of the second insulating layer and overlapping the third via electrode in the horizontal direction, and wherein a width of the fourth via electrode in the horizontal direction is different from a width of the third via electrode in the horizontal direction.

8. The circuit board of claim 7, wherein the width of the fourth via electrode in the horizontal direction is larger than the width of the third via electrode in the horizontal direction.

9. The circuit board of claim 5, wherein the connection member includes a connection electrode, and wherein a lower surface of the third via electrode is in direct contact with an upper surface of the connection electrode.

10. The circuit board of claim 1, wherein the second insulating layer includes an insulating material different from insulating materials of the upper insulating layer and the lower insulating layer.

* * * * *